United States Patent
Kuo et al.

(10) Patent No.: US 7,570,514 B2
(45) Date of Patent: Aug. 4, 2009

(54) METHOD OF OPERATING MULTI-LEVEL CELL AND INTEGRATE CIRCUIT FOR USING MULTI-LEVEL CELL TO STORE DATA

(75) Inventors: Ming-Chang Kuo, Hsinchu (TW); Chao-I Wu, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 53 days.

(21) Appl. No.: 11/625,456

(22) Filed: Jan. 22, 2007

(65) Prior Publication Data
US 2008/0175046 A1    Jul. 24, 2008

(51) Int. Cl.
G11C 16/04    (2006.01)

(52) U.S. Cl. .................. 365/185.03; 365/185.18; 365/185.28; 365/185.24

(58) Field of Classification Search ............ 365/185.24, 365/185.18, 185.03, 185.28
See application file for complete search history.

(56) References Cited

U.S. PATENT DOCUMENTS

| | | | |
|---|---|---|---|
| 6,011,725 A | 1/2000 | Eitan | |
| 6,744,675 B1 * | 6/2004 | Zheng et al. | 365/185.28 |
| 6,898,129 B2 * | 5/2005 | Swift et al. | 365/185.29 |
| 7,020,018 B2 * | 3/2006 | Hsieh et al. | 365/185.03 |
| 7,098,505 B1 * | 8/2006 | Han et al. | 257/324 |
| 7,342,832 B2 * | 3/2008 | Lee et al. | 365/185.25 |
| 7,352,619 B2 * | 4/2008 | Ho | 365/185.03 |
| 7,366,026 B2 * | 4/2008 | Lee | 365/185.29 |
| 2007/0196982 A1 * | 8/2007 | Eitan | 438/257 |

* cited by examiner

Primary Examiner—Huan Hoang
(74) Attorney, Agent, or Firm—J.C. Patents (57) ABSTRACT

A method of operating a multi-level cell is provided. The method includes the following the steps. (a) The multi-level cell is operated until a threshold voltage is larger than a pre-programming threshold voltage. And (b) the multi-level cell is operated until the threshold voltage is larger than a target programming threshold voltage and smaller than the pre-programming threshold voltage. Moreover, between the step (a) and the step (b), further comprises (c) A first verification step is performed. If the threshold voltage is smaller than the pre-programming threshold voltage, then repeat the step (a). Furthermore, after the step (b), further comprises (d) a second verification step is performed. If the threshold voltage is larger than the pre-programming threshold voltage, repeat the step (b), and if the threshold voltage is smaller than the target programming threshold voltage, repeat the steps (a)-(d).

19 Claims, 8 Drawing Sheets

METHOD OF OPERATING MULTI-LEVEL CELL AND INTEGRATE CIRCUIT FOR USING MULTI-LEVEL CELL TO STORE DATA

BACKGROUND OF THE INVENTION

1. Field of the Invention

The present invention relates to a method of operating a semiconductor device. More particularly, the present invention relates to a method of operating a multi-level cell (MLC) of a non-volatile memory.

2. Description of Related Art

Among various types of memory products, one non-volatile memory is a memory has widely used in personal computers and electronic products. In one non-volatile memory, data can be stored, read out or erased numerous times, and any stored data can be retained even after power is cut off.

A typical non-volatile memory is capable of storing two data states of "0" and "1", and is a memory that storages one bit per cell (1 bit/cell). When reading data in the memory, a gate voltage is set to Vread. As Vread is larger than a threshold voltage (Vt) of the memory, a current flows through a source and a drain of the memory, and the data state is determined to be "1". As Vread is smaller than a threshold voltage of the memory, don't have any current flows through the source and the drain of the memory, and the data state is determined to be "0".

In recent years, with the development of high-density memory devices, each cell of the non-volatile memories can store more than one bit, i.e., the non-volatile memory is a so-called multi-level memory device. Each cell of this kind of memories can store multi-bit (two or more bits) data. Thus, the density of the stored data on the same chip area is increased. In order to store two or more bits of data in each cell, each cell is programmed to $2^2$ levels, i.e., 4 levels. Here, the threshold voltages of the 4 levels are corresponding to 4 storage states of "00", "00", "10", and "11" respectively.

However, as each cell in the multi-level memory device is programmed, the amount of injected electrons cannot be controlled precisely. Thus, the Vt-distribution curve of cells in various storage states is broad, which easily causing error in the reading. Moreover, the programming step that controls the threshold voltages in time mode, so that it is difficult to precisely obtain the target programming Vt.

The problem of the cells described above may influence the device performance, and reduce the reliability of the device. Therefore, it has become an important subject of the industry to solve this problem.

SUMMARY OF THE INVENTION

Accordingly, the present invention is directed to provide a method of operating a multi-level cell, which effectively solves the problem in the prior art, and improves the device performance.

The present invention provides a method of operating a multi-level cell. The multi-level cell comprises a substrate, a control gate, a charge storage layer disposed between the substrate and the control gate, and a source region and a drain region in the substrate. The method includes the following steps. (a) The multi-level cell is operated until a threshold voltage is larger than a pre-programming threshold voltage. And (b) The multi-level cell is operated until the threshold voltage is larger than a target programming threshold voltage and smaller than the pre-programming threshold voltage.

In the method of operating the multi-level cell according to an embodiment of the present invention, the operation of the step (a) described above is a programming operation. For example, the programming operation is performed by a channel hot electron (CHE) injection, a Fowler-Nordheim (FN) electron injection, or a double side bias (DSB) electron injection process.

In the method of operating the multi-level cell according to an embodiment of the present invention, the operation of the step (b) described above is a soft-erasing operation. For example, the soft-erasing operation is performed by a band-to-band hot hole (BTBHH) injection, a FN electron exclusion, or a DSB hole injection process.

In the method of operating the multi-level cell according to an embodiment of the present invention, after performing the step (a) and before performing the step (b), further comprises: (c) performing a first verification step, wherein if the threshold voltage is smaller than the pre-programming threshold voltage, then repeat the step (a). The first verification step of the step (c) described above comprises, for example, performing a reading operation, so as to determine whether the threshold voltage of the step (a) is larger than the pre-programming threshold voltage according to a reading voltage of the multi-level cell.

In the method of operating the multi-level cell according to an embodiment of the present invention, after performing the step (b), further comprises: (d) performing a second verification step, wherein if the threshold voltage is larger than the pre-programming threshold voltage, then repeat the step (b), and if the threshold voltage is smaller than the target programming threshold voltage, then repeat the steps (a)-(d). The second verification step of the step (d) described above comprises, for example, performing a reading operation, so as to determine whether the threshold voltage of the step (b) is larger than the target programming threshold voltage and smaller than the pre-programming threshold voltage according to the reading voltage of the multi-level cell.

In the method of operating the multi-level cell according to an embodiment of the present invention, the charge storage layer described above is, for example, a floating gate, a charge-trapping layer, or a nano-crystal layer.

The present invention provides an integrated circuit using multi-level cell for data storage. The integrated circuit comprises a semiconductor substrate, a multi-level cell array, a bias arrangement machine and circuitry. The multi-level cell array is coupled to the semiconductor substrate. The bias arrangement machine is used to operate the multi-level cell of the array until a threshold voltage of the multi-level cell is larger than a pre-programming threshold voltage. The circuitry is coupled to the array of the multi-level cells. The circuitry adapted to couple voltage to one or more cells of the array of multi-level cells for a particular duration from a plurality of particular durations has a corresponding data value from a plurality of data values that are storable on the multi-level cells. And, the circuitry comprises at least a row decoder and a column decoder coupled to the array and a sense amplifiers/data in structures coupled to the column decoder. The sense amplifiers/data in structures is used to operate the multi-level cell of the array until the threshold voltage of the multi-level cell is larger than a target programming threshold voltage and smaller than the pre-programming threshold voltage.

In the method of the integrated circuit according to an embodiment of the present invention, the row decoder and the column decoder are used to read the voltage of the multi-level cell of the array.

In the method of the integrated circuit according to an embodiment of the present invention, the charge storage layer of the multi-level cell described above is, for example, a floating gate, a charge-trapping layer, or a nano-crystal layer.

According to the present invention, the threshold voltage of the cell is made to be larger than the pre-programming threshold voltage first, and the threshold voltage of the cell is made to be between the pre-programming threshold voltage and the target programming threshold voltage. Thus, the cell reaches the target threshold voltage (target Vt) precisely. Moreover, the method of the present invention narrows the range of the Vt-distribution of the cell in various memory states, and thus the possibility of reading error is reduced.

In order to make the aforementioned and other objects, features and advantages of the present invention comprehensible, preferred embodiments accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In a cell to which the method of operating a multi-level cell of the present invention can be applied, the charge storage layer is, for example, a floating gate, a charge-trapping layer or a nano-crystal layer. Usually, the material of the floating gate is doped poly-Si, the material of the charge-trapping layer is silicon nitride, and the nano-crystal layer includes many separate nano-crystals of a conductor material in an insulative layer. Although only the cell including the charge-trapping, layer is exemplified in this embodiment, persons of ordinary skill in the art can derive from the illustration of this embodiment that the present invention is also applicable to a non-volatile multi-level cell using the floating gate or the nano-crystal layer for data storage.

Figure 1:
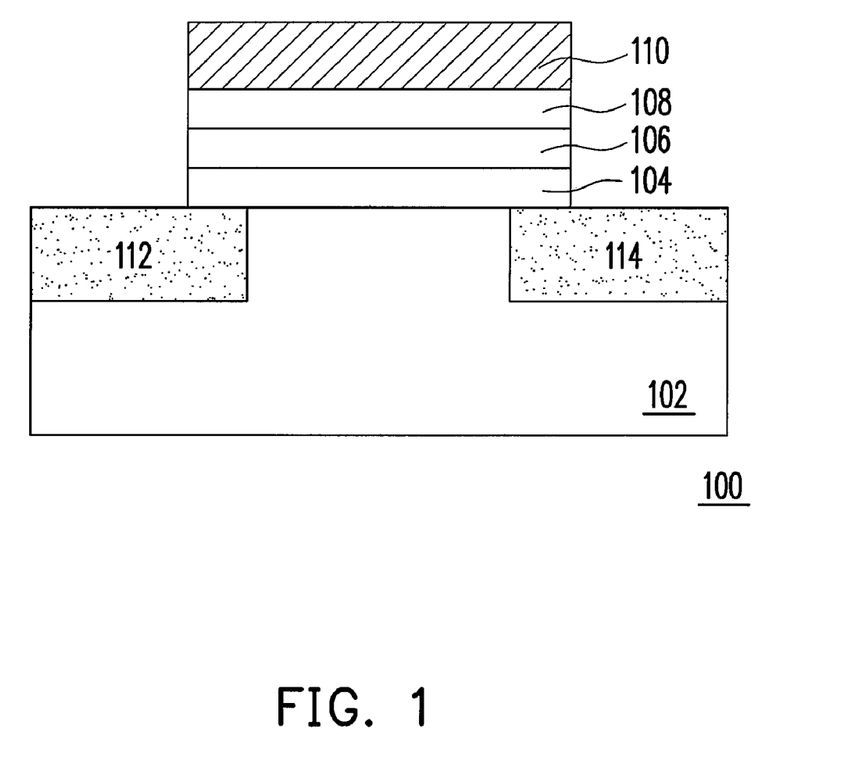
FIG. 1 is a schematic view of a multi-level cell according to an embodiment of the present invention.

FIG. 1 is a schematic view of a multi-level cell according to an embodiment of the present invention. Referring to FIG. 1, the cell 100 in this embodiment includes a P-type substrate 102, and a bottom oxide layer 104, a silicon nitride layer 106 serving as the charge-trapping layer, a top oxide layer 108, and a control gate 110 that are stacked upward sequentially on the substrate 102, and an N-type source region 112 and an N-type drain region 114 disposed in the substrate 102 beside of the control gate 110. In addition, in one example of the cell having a floating gate as the charge storage layer, the three layers 104, 106, and 108 are replaced with a tunneling oxide layer, a poly-Si floating gate, and an inter-gate dielectric layer respectively. In one example of the cell having a nano-crystal layer as the charge storage layer, the layer 106 is replaced with an oxide layer that has many nano silicon crystals therein.

Then, the method of operating a multi-level cell in the present invention will be illustrated. Using a multi-level cell that storages two-bit per cell (2 bits/cell) as an example, each of the four storage states of "00", "01", "10", "11" of the multi-level cell has a pre-programming threshold voltage Pre-programming threshold voltage and a target programming threshold voltage Target programming threshold voltage, and as for each storage state, the Pre-programming threshold voltage is appreciably larger than the Target programming threshold voltage, in which the difference therebetween is 0.1-0.5 V. The method of operating the multi-level cell in each of the storage states is described as follows.

Figure 2:
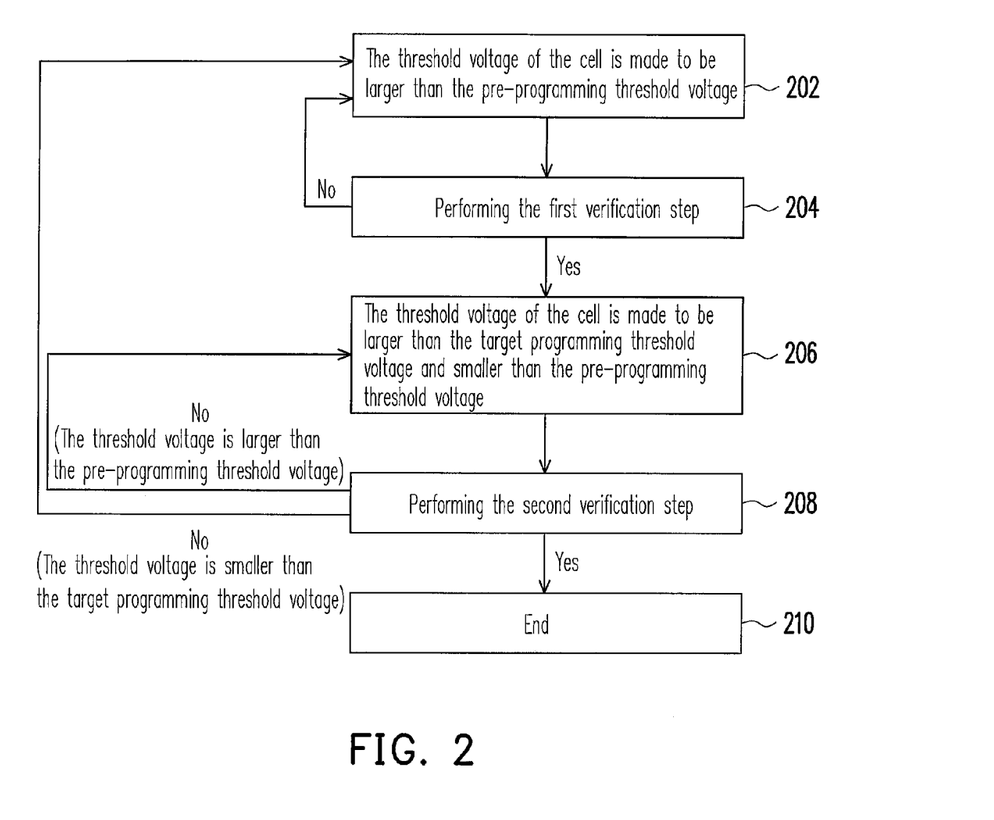
FIG. 2 is a schematic view of the processes of a method of operating a multi-level cell according to an embodiment of the present invention.

FIG. 2 is a flow chart of a method of operating a multi-level cell according to an embodiment of the present invention. Referring to FIG. 2, the threshold voltage (Vt) of the cell is made to be larger than the Pre-programming threshold voltage (Step 202). In the step 202, a programming operation is performed on the cell until the Vt of the cell is larger than the Pre-programming threshold voltage.

Then, referring to FIG. 2 again, after performing the step 202, a first verification step is performed (Step 204). The first verification step includes, for example, performing a reading operation, so as to determine whether the Vt of the step 202 is larger than the Pre-programming threshold voltage according to a reading voltage of the cell. In the step 204, if the Vt of the cell is larger than the Pre-programming threshold voltage, then proceed to perform the next step. Otherwise, if the Vt of the cell is smaller than the Pre-programming threshold voltage, then repeat the step 202.

Then, the Vt of the cell is made to be larger than the Target programming threshold voltage and smaller than the Pre-programming threshold voltage (Step 206). In the step 206, a soft-erasing operation is performed on the cell until the Vt of the cell is larger than the Target programming threshold voltage and smaller than the Pre-programming threshold voltage. It should be noted that the Vt can be modified to be lower and converge to a voltage near the Target programming threshold voltage in the step.

Then, referring to FIG. 2 again, a second verification step (Step 208) is performed after the step 206. The second verification step includes, for example, performing a reading operation, so as to determine whether the Vt of the step 206 is between the Pre-programming threshold voltage and the Target programming threshold voltage according to the reading voltage of the cell. In the step 208, if the Vt of the cell is between the Pre-programming threshold voltage and the Target programming threshold voltage, the operation is completed (Step 210). Otherwise, if the Vt of the cell is larger than the Pre-programming threshold voltage, then repeat the step 206, and if the Vt of the cell is smaller than the Target programming threshold voltage, repeat the steps 202-208.

It should be noted that according to the operating method in the present invention, the Vt of the cell is made to be larger than the Pre-programming threshold voltage first, and then the Vt of the cell is made to be between the Pre-programming threshold voltage and the Target programming threshold voltage. Thus, the cell can obtain the target Vt more precisely. Moreover, the method of the present invention narrows the range of Vt-distribution of the cell in various memory states, and thus the possibility of reading error is reduced.

Figure 3A:
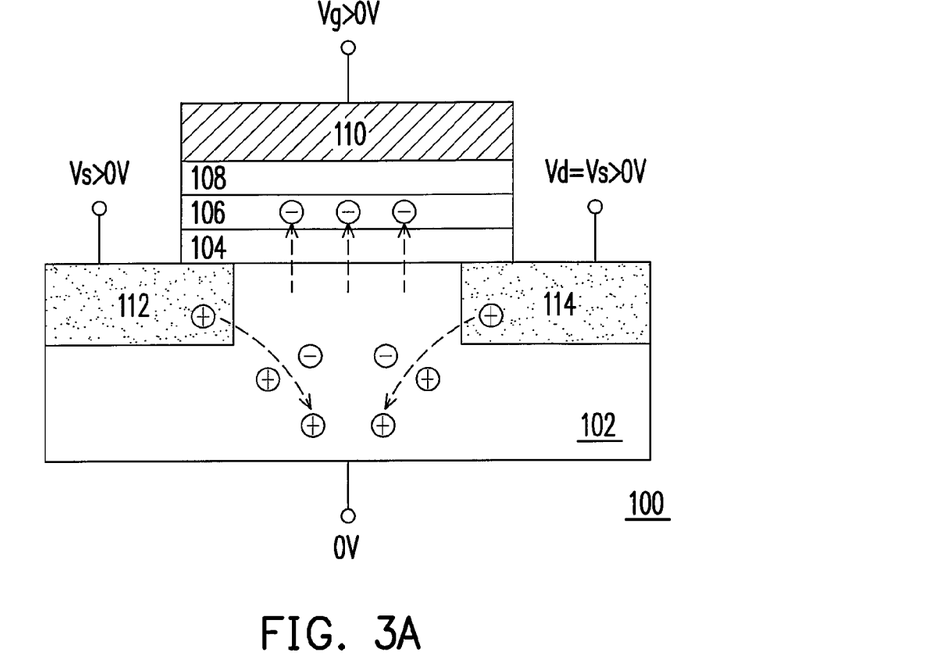
FIGS. 3A and 3B show a programming step and a soft-erasing step of the method of operating a multi-level cell respectively according to an embodiment of the present invention.
Figure 3B:
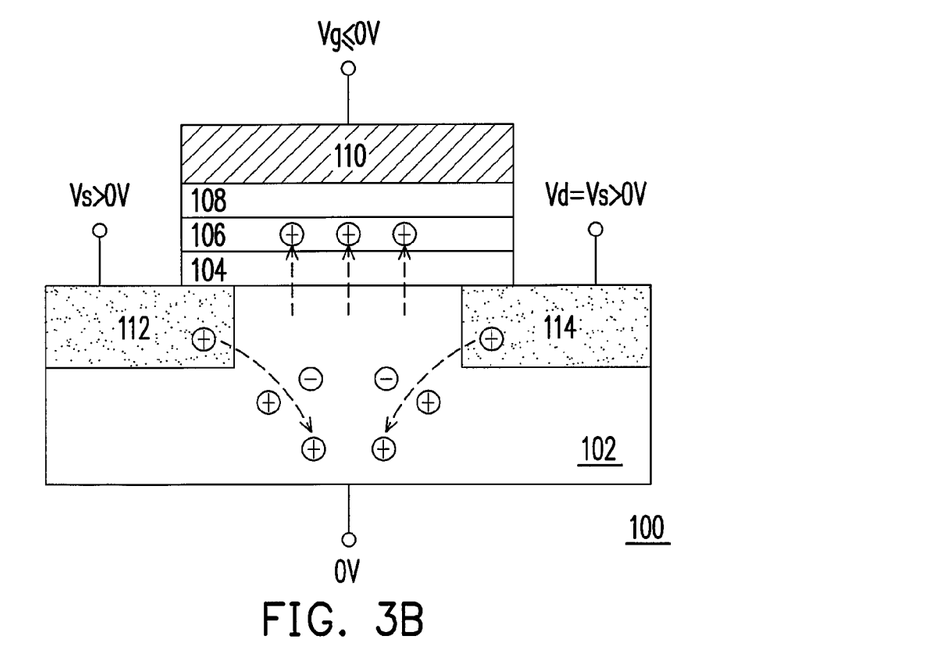

The embodiment of FIGS. 3A and 3B is described in detail below to illustrate the programming operation and the soft-erasing operation of the operating method in the present invention.

FIG. 3A shows the programming step of the multi-level cell of this embodiment, which is performed by a double side bias (DSB) electron injection process. The programming step includes applying 0 V to the substrate 102, applying a source voltage Vs and a drain voltage Vd (=Vs) which is higher than 0 V to the source region 112 and the drain region 114 respectively, and applying a gate voltage Vg which is higher than 0 V to the control gate 110. For example, the source voltage Vs between 4 V to 6 V, the drain voltage Vd between 4 V to 6 V, and the gate voltage Vg between 8 V to 12 V. The source voltage Vs and the drain voltage Vd are adequate to generate band-to-band hot holes in the substrate 102, so as to form electron/hole pairs, and the gate voltage Vg applied to the control gate 110 enables the electrons to be injected into the charge storage layer.

Figure 4:
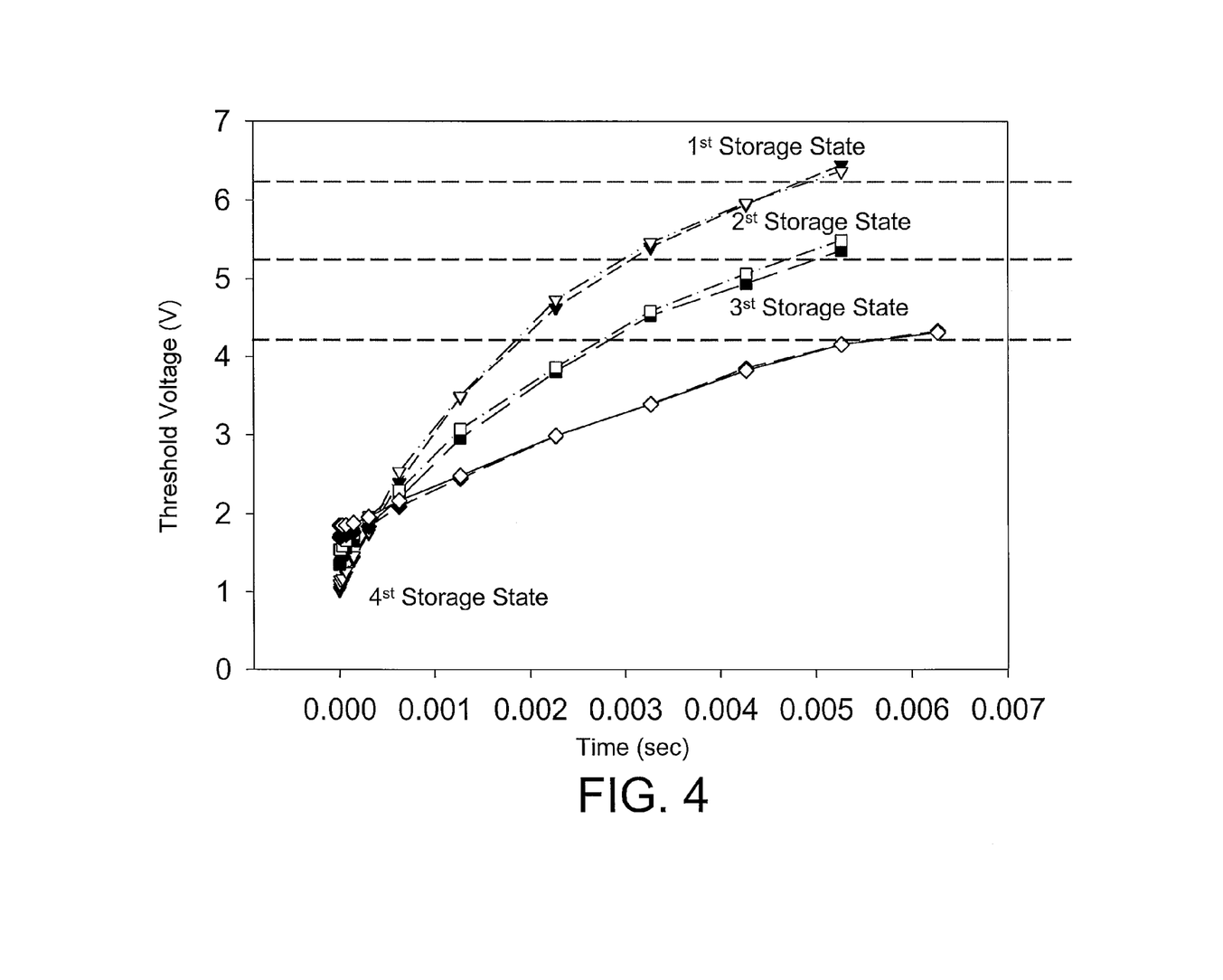
FIG. 4 shows the change of the threshold voltage of the cell along with the time during the programming step of the method of operating a multi-level cell of the present invention.

FIG. 4 shows the change of the threshold voltage (V) of the cell along with the time (sec) during the programming step of the method of operating a multi-level cell of the present invention. Referring to FIG. 4, the multi-level cell has 4 storage states corresponding to 4 levels, and stores 2 bits of data. For example, the first to fourth storage states with levels from high to low are corresponding to data values of "00", "01", "10", and "11" respectively. Moreover, parallel dashed lines in FIG. 4 are corresponding to the pre-programming threshold voltages of various storage states of the cell. It can be known from FIG. 4 that the cell can be programmed until the threshold voltages are larger than the pre-programming threshold voltages.

In addition, FIG. 3B shows the soft-erasing step of the multi-level cell of this embodiment, which is performed by a DSB hole injection process. Referring to FIG. 3B, the soft-erasing step includes applying 0 V to the substrate 102, applying a source voltage Vs and a drain voltage Vd (=Vs) which is higher than 0 V to the source region 112 and the drain region 114 respectively, and applying a gate voltage Vg which is lower than or equal to 0 V to the control gate 110. For example, the source voltage Vs between 4 V to 6 V, the drain voltage Vd between 4 V to 6 V, and the gate voltage Vg between −5 V to 0 V. The source voltage Vs and the drain voltage Vd are adequate to generate frequency band tunneling hot holes in the substrate 102, so as to form electron/hole pairs, and the gate voltage Vg applied to the control gate 110 enables the holes to be injected into the charge storage layer.

Figure 5:
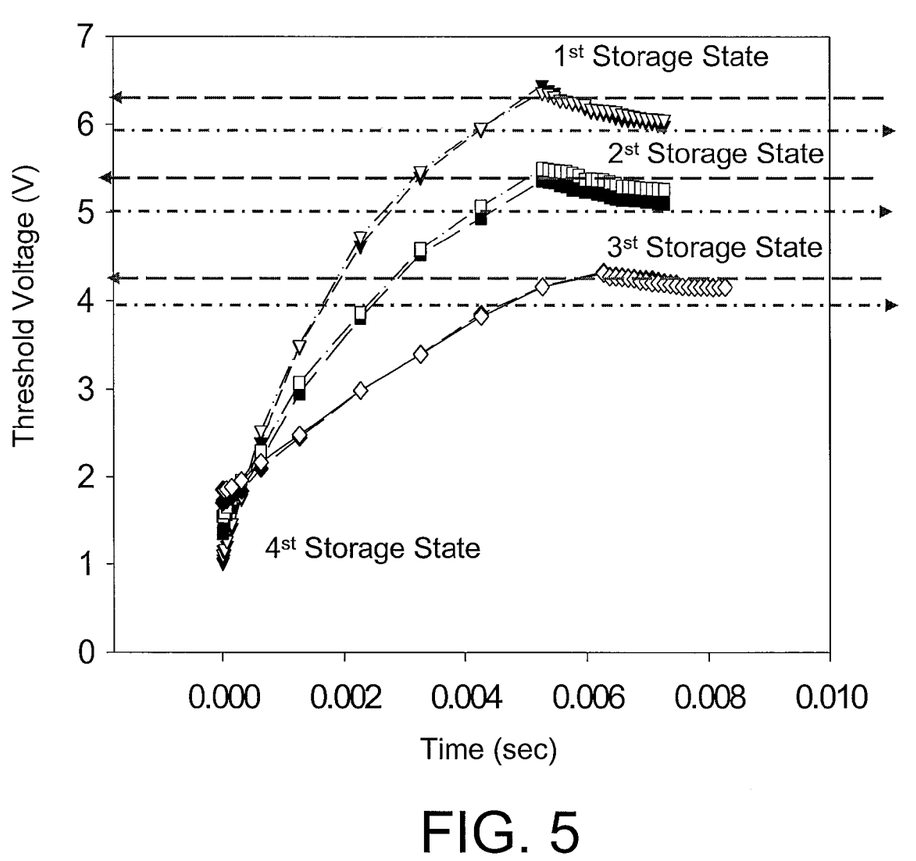
FIG. 5 shows the change of the threshold voltage of the cell along with the time during the soft-erasing step of the method of operating a multi-level cell of the present invention.

FIG. 5 shows the change of the threshold voltage of the cell along with the time during the soft-erasing step of the method of operating a multi-level cell of the present invention. Referring to FIG. 5, the multi-level cell has 4 storage states corresponding to 4 levels, and stores 2 bits of data. For example, the first to fourth storage states with levels from high to low are corresponding to data values of "00", "01", "10", and "11" respectively. Moreover, dashed lines (--) and dash-dot lines (-•-) in parallel in FIG. 5 are corresponding to the pre-programming threshold voltages and the target programming threshold voltages of various storage states of the cell respectively. It is known from FIG. 5 that the cell can be soft-erased to the threshold voltage between the pre-programming threshold voltage and the target programming threshold voltage and converge to a voltage near the target programming threshold voltage.

Moreover, in the operating method of the present invention, the programming operation of the step 202 can be performed by the channel hot electron (CHE) injection process, and the soft-erasing operation of the step 206 can be performed by the band-to-band hot hole (BTBHH) injection process.

Figure 6A:
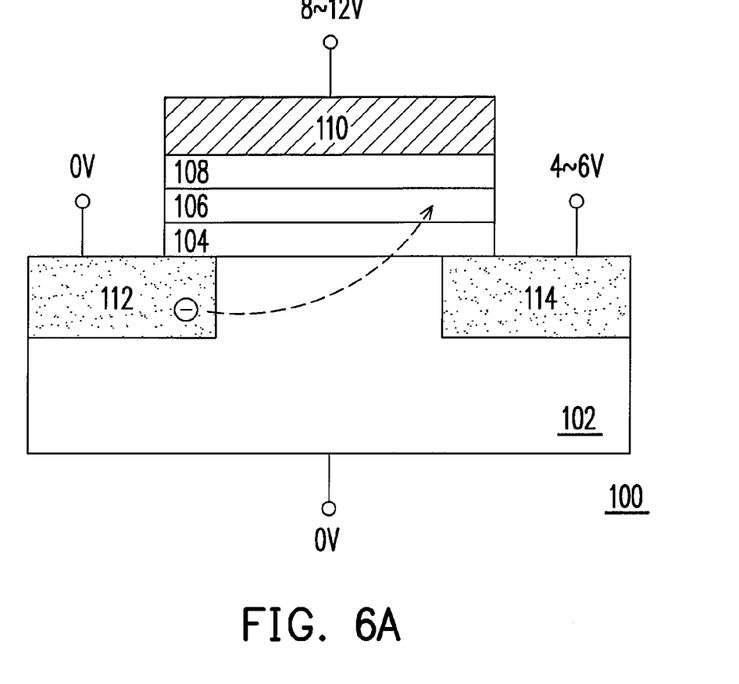
FIGS. 6A and 6B show a programming step and a soft-erasing step of the method of operating a multi-level cell respectively according to another embodiment of the present invention.
Figure 6B:
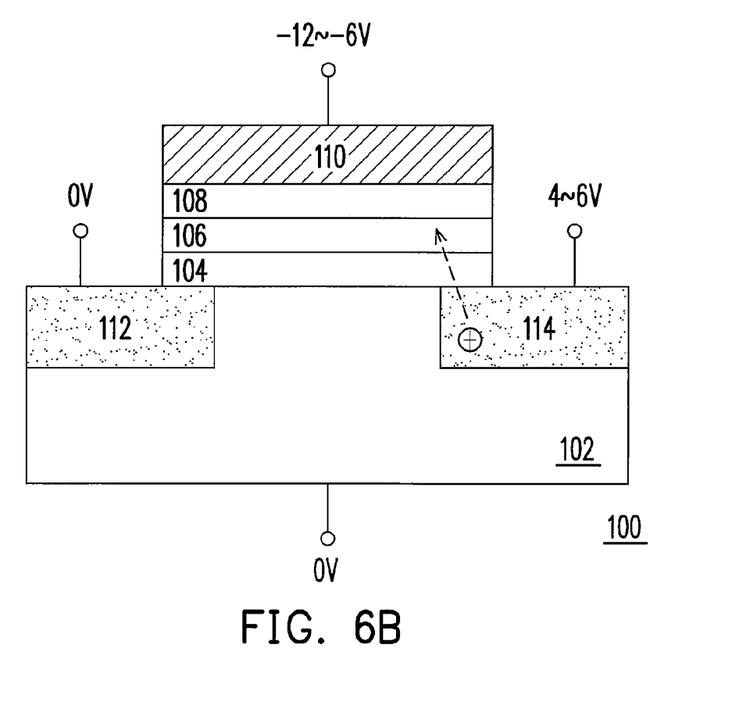

FIG. 6A shows the programming step of the multi-level cell of this embodiment, which is performed by a CHE injection process. Referring to FIG. 6A, the programming method includes, for example, applying 0 V to the substrate 102, applying 0 V to the source region 112, applying a drain voltage Vd which is higher than 0 V (e.g., between 4 V to 6 V) to the drain region 114, and applying a gate voltage Vg which is higher than 0 V (e.g., between 8 V to 12 V) to the control gate 110, so as to inject the generated electrons into the charge storage layer from the source region 112. In addition, FIG. 6B shows the soft-erasing step of the multi-level cell of this embodiment, which is performed by a BTBHH process. Referring to FIG. 6B, the soft-erasing method includes, for example, applying 0 V to the substrate 102, applying 0 V to the source region 112, applying a drain voltage Vd which si higher than 0 V (e.g., between 4 V to 6 V) to the drain region 114, and applying a gate voltage Vg lower than 0 V (e.g., between −12 V to −6 V) to the control gate 110, so as to inject the generated holes into the charge storage layer from the drain region 114.

Moreover, in the operating method of the present invention, as for a cell using a floating gate as the charge storage layer, the programming operation of the step 202 can be performed by the FN electron injection process, and the soft-erasing operation can be performed by the FN electron exclusion process.

Figure 7A:
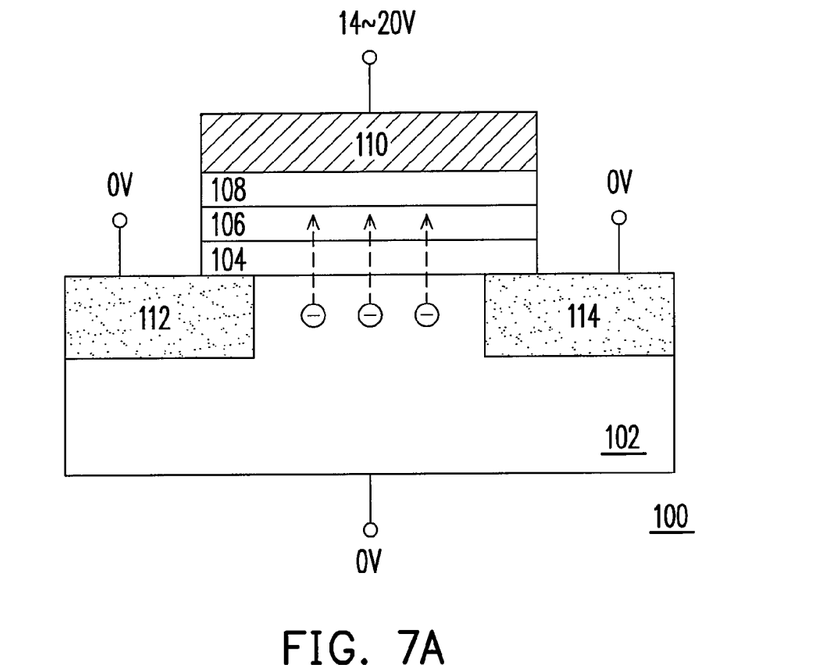
FIGS. 7A and 7B show a programming step and a soft-erasing step of the method of operating a multi-level cell respectively according to yet another embodiment of the present invention.
Figure 7B:
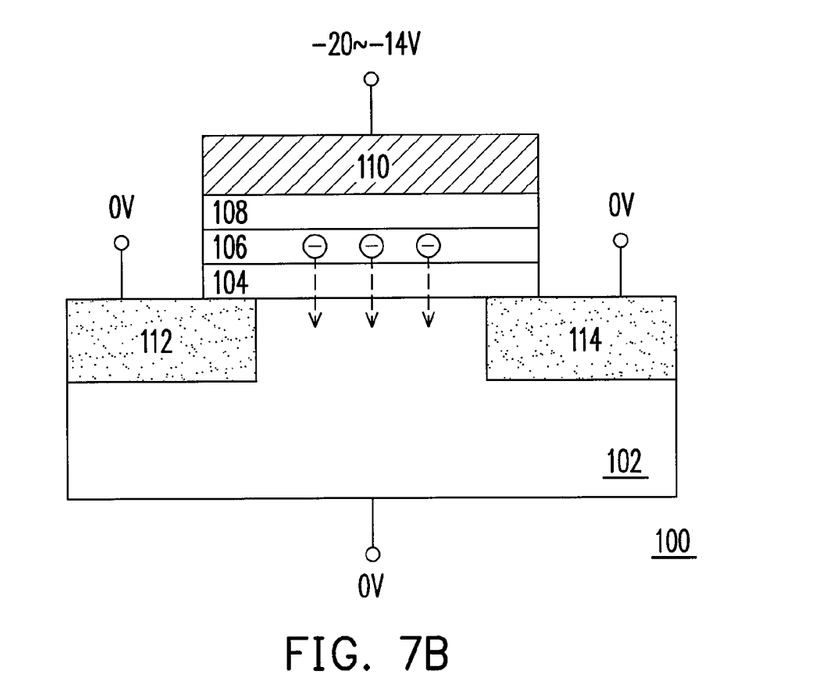

FIG. 7A shows the programming step of the multi-level cell of this embodiment, which is performed by a FN electron injection process. Referring to FIG. 7A, the programming operation includes, for example, applying 0 V to the substrate 102, applying 0 V to the source region 112, applying 0 V to the drain region 114, and applying a gate voltage Vg higher than 0 V (e.g., between 14 V to 20 V) on the control gate 110, so as to cause a FN tunneling effect, such that the electrons are injected into the charge storage layer (the floating gate). In addition, FIG. 7B shows the soft-erasing step of the multi-level cell of this embodiment, which is performed by a FN electron exclusion process. Referring to FIG. 7B, the soft-erasing operation includes, for example, applying 0 V to the substrate 102, applying 0 V to the source region 112, applying 0 V to the drain region 114, and applying a gate voltage Vg which is lower than 0 V (e.g., between −20 V to −14 V) to the control gate 110, so as to cause the FN tunneling effect, such that the electrons are injected into the substrate 102 from the charge storage layer (the floating gate).

Figure 8:
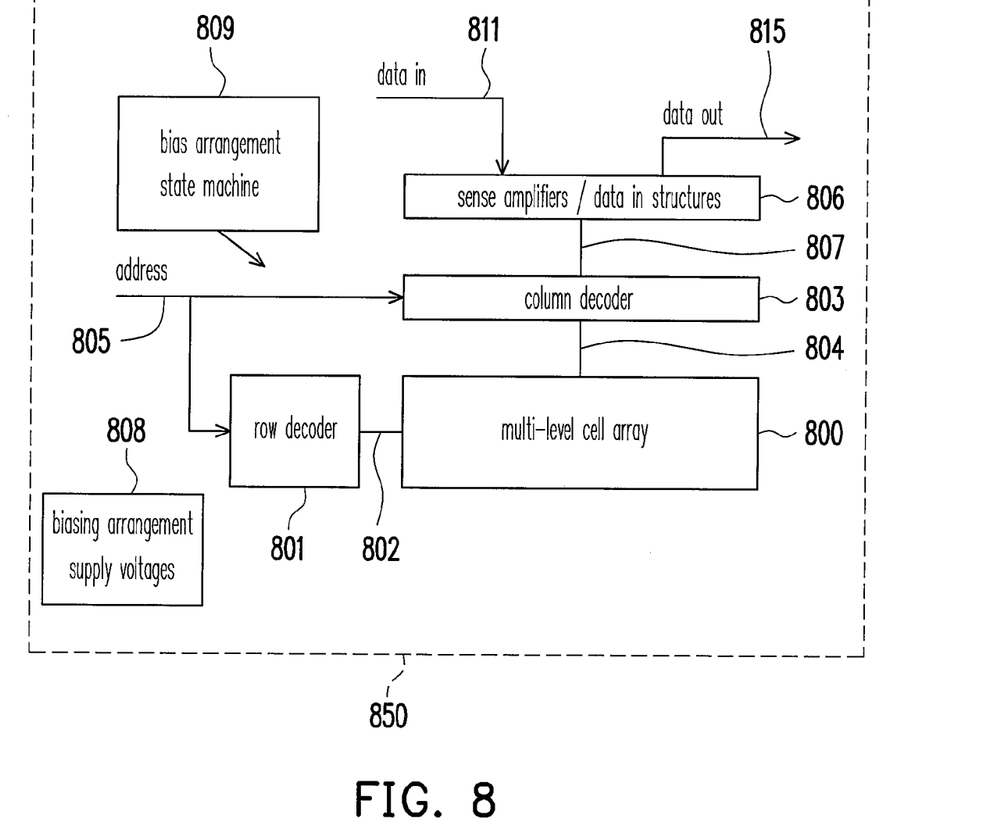
FIG. 8 shows a simplified block diagram of an integrated circuit with the multi-level cell according to an embodiment of the present invention.

FIG. 8 shows a simplified block diagram of an integrated circuit with the multi-level cell according to an embodiment of the present invention.

Referring to FIG. 8, an integrated circuit 850 comprises a multi-level cell array 800 on a semiconductor substrate. Besides, the integrated circuit 850 comprises a row decoder 801 and a column decoder 803. The row decoder 801 is coupled to a plurality of word lines 802 and is disposed along rows in the array 800. The column decoder 803 is coupled to a plurality of bit lines 804 and is disposed along columns in the array 800. The row decoder 801 and the column decoder 803 are used to read the voltage of the multi-level cell of the array 800. Addresses are supplied on bus 805 to the row decoder 801 and the column decoder 803. Sense amplifiers and data-in structures in block 806 are coupled to the column decoder 803 via data bus 807. Data is supplied via a data-in line 811 from input/output ports on the integrated circuit 850, or from other data sources internal or external to the integrated circuit 850, to the data-in structures in block 806. Data is supplied via the data-out line 815 from the sense amplifiers in block 806 to input/output ports on the integrated circuit 850, or to other data destinations internal or external to the integrated circuit 850. A bias arrangement machine 809 controls the application of bias arrangement supply voltages 808, such as for the erase verify and program verify voltages, and the arrangements for programming, erasing and reading the multi-level cells. The bias arrangement machine 809 are used to operate the multi-level cell of the array 800 until a threshold voltage of the multi-level cell is larger than a pre-programming threshold voltage which means performing a programming operation. The sense amplifiers/data in structures 806 is used to operate the multi-level cell of the array 800 until the threshold voltage of the multi-level cell is larger than a target programming threshold voltage and smaller than the pre-programming threshold voltage which means performing a soft-erasing operation. A programming operation is performed on the array 800 by a channel hot electron injection process, a Fowler-Nordheim electron injection process and a double side bias electron injection process. A soft-erasing operation is performed on the array. 800 by a band-to-band hot hole injection process, a FN electron exclusion process and a DSB hole injection process.

It is known from the above description that the operating method of the present invention enables the cell to reach the target programming threshold voltage precisely. Moreover, the method of the present invention narrows the range of the Vt-distribution of the cell in various memory states, and thus the possibility of reading error is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a multi-level cell, the multi-level cell comprising a substrate, a control gate, a charge storage layer disposed between the substrate and the control gate, and a source region and a drain region in the substrate, the method comprising:
   (a) operating the multi-level cell until a threshold voltage of the multi-level cell is larger than a pre-programming threshold voltage;
   (b) operating the multi-level cell until the threshold voltage of the multi-level cell is larger than a target programming threshold voltage and smaller than the pre-programming threshold voltage;
   (c) after performing the step (a) and before performing the step (b), performing a first verification step, wherein if the threshold voltage is smaller than the pre-programming threshold voltage, then repeat the step (a); and
   (d) after performing the step (b), performing a second verification step, wherein if the threshold voltage is larger than the pre-programming threshold voltage, then repeat the step (b), and if the threshold voltage is smaller than the target programming threshold voltage, then repeat the steps (a)-(d).

2. The method of operating the multi-level cell as claimed in claim 1, wherein an operation of the step (a) is a programming operation.

3. The method of operating the multi-level cell as claimed in claim 2, wherein the programming operation is performed by a channel hot electron (CHE) injection process.

4. The method of operating the multi-level cell as claimed in claim 2, wherein the programming operation is performed by a Fowler-Nordheim (FN) electron injection process.

5. The method of operating the multi-level cell as claimed in claim 2, wherein the programming operation is performed by a double side bias (DSB) electron injection process.

6. The method of operating the multi-level cell as claimed in claim 1, wherein an operation of the step (b) is a soft-erasing operation.

7. The method of operating the multi-level cell as claimed in claim 6, wherein the soft-erasing operation is performed by a band-to-band hot hole (BTBHH) injection process.

8. The method of operating the multi-level cell as claimed in claim 6, wherein the soft-erasing operation is performed by a FN electron exclusion process.

9. The method of operating the multi-level cell as claimed in claim 6, wherein the soft-erasing operation is performed by a DSB hole injection process.

10. The method of operating the multi-level cell as claimed in claim 1, wherein the first verification step of the step (c) comprises performing a reading operation, so as to determine whether the threshold voltage of the step (a) is larger than the pre-programming threshold voltage according to a reading voltage of the multi-level cell.

11. The method of operating the multi-level cell as claimed in claim 1, wherein the second verification step of the step (d) comprises performing a reading operation, so as to determine whether the threshold voltage of the step (b) is larger than the target programming threshold voltage and smaller than the pre-programming threshold voltage according to a reading voltage of the multi-level cell.

12. The method of operating the multi-level cell as claimed in claim 1, wherein the charge storage layer is a floating gate.

13. The method of operating the multi-level cell as claimed in claim 1, wherein the charge storage layer is a charge-trapping layer.

14. The method of operating the multi-level cell as claimed in claim 1, wherein the charge storage layer is a nano-crystal layer.

15. A integrated circuit using multi-level cell for data storage, comprising
   a semiconductor substrate;
   a multi-level cell array coupled to the semiconductor substrate;
   a bias arrangement machine, used to operate the multi-level cell of the array until a threshold voltage of the multi-level cell is larger than a pre-programming threshold voltage; and
   circuitry coupled to the array of the multi-level cells, the circuitry configured to couple voltage to one or more cells of the array of multi-level cells for a particular duration from a plurality of particular durations has a corresponding data value from a plurality of data values that are storable on the multi-level cells, and the circuitry comprises at least a row decoder and a column decoder coupled to the array and sense amplifiers/data in structures coupled to the column decoder, wherein the sense amplifiers/data in structures is used to operate the multi-level cell of the array until the threshold voltage of the multi-level cell is larger than a target programming threshold voltage and smaller than the pre-programming threshold voltage.

16. The method of the integrated circuit as claimed in claim 15, wherein the row decoder and the column decoder are used to read the voltage of the multi-level cell of the array.

17. The method of the integrated circuit as claimed in claim 15, wherein the charge storage layer of the multi-level cell is a floating gate.

18. The method of the integrated circuit as claimed in claim 15, wherein the charge storage layer of the multi-level cell is a charge-trapping layer.

19. The method of the integrated circuit as claimed in claim 15, wherein the charge storage layer of the multi-level cell is a nano-crystal layer.

* * * * *